United States Patent [19]
Chamberlain et al.

[11] Patent Number: 5,167,997
[45] Date of Patent: Dec. 1, 1992

[54] PROTECTED CONDUCTIVE FOIL ASSEMBLAGE AND PROCEDURE FOR PREPARING SAME USING STATIC ELECTRICAL FORCES

[75] Inventors: Jamie H. Chamberlain, Concord; Rolland D. Savage; John P. Callahan, both of Mentor; David P. Burgess, McConnelsville, all of Ohio

[73] Assignee: Gould Inc., Eastlake, Ohio

[21] Appl. No.: 501,093

[22] Filed: Mar. 29, 1990

Related U.S. Application Data

[63] Continuation-in-part of Ser. No. 347,841, May 5, 1989, abandoned.

[51] Int. Cl.⁵ .............................................. B32B 3/02
[52] U.S. Cl. ...................................... 428/76; 428/409; 428/457; 428/461; 428/480; 428/901; 156/60; 29/900
[58] Field of Search ............... 428/76, 409, 457, 461, 428/480, 901; 156/60; 29/900

[56] References Cited

U.S. PATENT DOCUMENTS

| | | | |
|---|---|---|---|
| 2,668,348 | 2/1954 | Hubbell | 428/198 |
| 2,706,165 | 4/1955 | Korsgaard | 154/126.5 |
| 2,864,755 | 12/1958 | Roghacker | 204/165 |
| 3,350,247 | 10/1967 | Steinberg | 156/1 |
| 3,589,975 | 6/1971 | Andrews | 161/165 |
| 3,647,592 | 3/1972 | Woodberry | 156/285 |
| 3,755,043 | 8/1973 | Igarashi | 156/272 |
| 4,022,648 | 5/1977 | Woodberry | 156/273 |
| 4,179,324 | 12/1979 | Kirkpatrick | 156/230 |
| 4,228,481 | 10/1980 | DiNicola et al. | 428/604 |
| 4,348,712 | 9/1982 | Newcomb | 361/315 |
| 4,446,188 | 5/1984 | Patel | 428/138 |
| 4,669,468 | 6/1987 | Cartnell et al. | 606/32 |

FOREIGN PATENT DOCUMENTS 0006232 2/1985 Japan.
0162769 8/1985 Japan.

OTHER PUBLICATIONS

DuPont Trade Bulletin, Mylar 92DB, High-Performance Films Division, Nov. 1986.

Primary Examiner—Patrick J. Ryan
Attorney, Agent, or Firm—Michael A. Centanni

[57] ABSTRACT

A conductive copper foil for use in preparing printed circuit boards is protected from damage during storage, shipment and further processing by covering at least one side of the foil with a sheet of plastic film. The film is removably joined with the foil as a result of the essential absence of gaseous material between the film and the foil. Thus, the film conforms intimately to the contours and shape of the foil surface and clings tightly thereto to permit movement and further processing of the foil with the film adhering tightly thereto. The absence of air between the film and the foil is produced by oppositely statically electrically charging the film and the foil such that they are forced together sufficiently to squeeze the air out from therebetween. The film is selected to be sufficiently resistant to laminating temperature and pressure conditions so as to remain in its covering, protecting relationship to the foil and avoid sticking to the laminating press plate and retain its removability from the foil after lamination.

36 Claims, 2 Drawing Sheets

PROTECTED CONDUCTIVE FOIL ASSEMBLAGE AND PROCEDURE FOR PREPARING SAME USING STATIC ELECTRICAL FORCES

BACKGROUND OF THE INVENTION

Cross-Reference to Related Application

This application is a continuation-in-part of co-pending commonly assigned application Ser. No. 07/347,841, filed May 5, 1989, the entirety of the disclosure of which is hereby specifically incorporated herein by reference thereto.

FIELD OF THE INVENTION

The present invention relates to etchable conductive foils useful in preparing printed circuit boards and particularly to a means and a method for protecting such foils from damage during the handling and further processing of the foil leading up to the etching procedures whereby the foil is converted into the lines and other components making up the conductive pathways for printed circuit board circuitry. In particular the invention provides a highly efficient and effective procedure for removably joining a protective film to a piece of foil using static electrical forces.

DESCRIPTION OF THE PRIOR ART

Printed circuit components have become widely used in a variety of applications for radios, televisions, computers, etc. Of particular interest are multi-layer printed circuit board laminates which have been developed to meet the demand for miniaturization of electronic components and the need for printed circuit boards having a high density of electrical interconnections and circuitry. In the manufacture of printed circuit boards, raw materials, including conductive foils, which are usually copper foils, and dielectric supports comprising organic resins and suitable reinforcements, are packaged together and processed under temperature and pressure conditions to produce products known as laminates. The laminates are then used in the manufacture of printed circuit board components. In this endeavor the laminates are processed by etching away portions of the conductive foil from the laminate surface to leave a distinct pattern of conductive lines and formed elements on the surface of the etched laminate. Further, laminates and/or laminate materials may then be packaged together with the etched product to form a multi-layer circuit board package. Additional processing, such as hole drilling and component attaching, will eventually complete the printed circuit board product. As printed circuit board technology has advanced to provide higher density boards with smaller printed circuit lines, surface contamination of the raw material products has become a significant problem which generally cannot be tolerated in a successful commercial application.

Although many of the printed circuit board manufacturing and handling procedures are potential sources of surface contamination, one significant problem area involves the construction and lamination procedures by which the laminated products are prepared. Generally speaking, in this connection, the construction of the laminates involves stacking (or lay-up) of conductive foil pieces and dielectric substrates (prepregs) which will then be bonded to one another in a laminating press. Residual particles, particularly those emanating from the prepreg raw materials, are known to be present in the lay-up room environment as a result of the handling of such materials. Eventually such particles may contaminate the surfaces of the conductive foil pieces bonded to the laminates.

Presently such contamination problems are dealt with by attempting to maintain a clean environment in the lay-up area by air filtration, intensified housekeeping techniques, etc. Additionally, the conductive foil surfaces of laminates may often simply be spot cleaned. However, spot cleaning is not necessarily an acceptable procedure for laminates clad with so-called double-treated, electrodeposited copper foils. Double-treated copper foils are those which have been treated on both the matte side and the shiny (drum) side for enhanced bonding ability and improved peel strength when bound to a prepreg. In this regard, it should be noted that while double-treated copper foils are theoretically more desirable than single-treated foils for preparing multi-layer laminates, because such prior treatment enables the elimination of the chemical oxide roughening step, i.e., black oxide treatment, that is otherwise required to enhance bonding and peel strength of the shiny side of the lines after etching, double-treated copper foils cannot be subjected to spot cleaning for removal of contamination because such cleaning would also remove the treatment and prevent, or at least interfere with, subsequent bonding of the conductive lines to another prepreg during fabrication of a multiple layer laminate.

Thus, in the past, surface contamination has been a major economical disadvantage in the production of printed circuit boards, and particularly in the production of multiple layer printed circuit board products having high component densities. Moreover, even through the use of such measures as the environmental control of the lay-up room area, those involved in the manufacture of printed circuit boards have not been able to achieve acceptable prevention of surface contamination without incurring major costs and losses of efficiency in manufacturing procedures. Spot cleaning of laminate surfaces is simply expensive and inefficient, and as indicated above, cannot be tolerated in applications which employ double-treated foils.

A number of proposals are presented in said co-pending 841 application for releasably or removably joining film layers to pieces of foil in a removable, overlying, covering, protecting relationship relative to at least one side of the foil. The present invention provides a highly efficient and effective improved procedure for removably joining the film and the foil.

SUMMARY OF THE INVENTION

The problems and shortcomings inherent in the prior art procedures and applications discussed above are minimized, if not eliminated entirely, by applying the concepts and principles of the present invention. Thus, the invention provides an effective means for protecting the surfaces of conductive foils throughout those procedures involved in the manufacture of printed circuit boards where surface contamination may potentially create problems and difficulties. Such protection results from the provision of a protected conductive foil assemblage comprising a conductive metallic foil which has two sides. One side of the foil is adapted, generally by chemical treatment, for bonding to a dielectric support during a lamination process involving pressing between plates of a laminating press. The protected assemblage further includes a dielectric plastic film layer which overlies the other side of the foil in covering, protecting relationship thereto. The plastic film layer is removably united or joined with the foil sufficiently to permit movement and further processing of the foil with the film layer remaining in said covering, protecting relationship relative to the other side of the foil. In accordance with the invention, the plastic film is removably united or joined with the foil as a result of the provision of an essential absence of gaseous material between the plastic film layer and said other side of the foil, whereby the plastic film layer conforms intimately to the contours and shape of the other side of the foil and clings tightly thereto sufficiently to permit movement and further processing of the foil with the film layer remaining in said covering, protecting relationship to said other side of the foil. The plastic film layer is removable from the foil by peeling. The plastic film is sufficiently resistant to the temperature and pressure conditions encountered during a lamination process to avoid sticking to a laminating press plate and to retain its removability from the foil after lamination of the foil to a dielectric support.

In a particularly preferred commercial aspect of the invention, the protected foil assemblage may include an electrodeposited foil having a matte side and a shiny side. The foil further may be a double-treated conductive metallic foil wherein both the matte side and the shiny side of the foil have been treated for enhanced lamination bonding and peel strength between the surface of the foil and a dielectric support. In accordance with this aspect of the invention, the plastic film is preferably removable after laminating without disturbing the treatment on the shiny side.

In another important aspect of the invention, the plastic film layer may be sufficiently transparent to permit visual inspection of the shiny side of the metallic foil while the film layer is in said covering, protecting relationship thereto. This is a particularly valuable aspect of the invention in connection with double-treated foils so that the treatment on the shiny side of the metallic foil may be visually inspected while the film layer is in said covering, protective relationship thereto.

In accordance with the invention, the assemblage may include a foil and a film layer which are each in the form of an elongated web, and the foil and the film layer webs may be wound up together in the form of a roll. In another aspect of the invention, the foil and the plastic film layer may be configured as sheets which are coextensive in size and the assemblage may include a coextensively sized dielectric support layer which contains a curable laminating resin disposed against the matte side of the foil.

In a preferable and more detailed aspect of the invention, the plastic film layer may have a thickness in the range of from about 0.5 to about 5.0 mils and which preferably is about 2.0 mils or less. In a commercially desirable form the thickness of the plastic film may be about 0.92 mil. Additionally, the plastic film layer should preferably be formed from a dielectric material that is capable of being exposed to the conditions encountered in a laminating press without releasing chemicals which might contaminate the foil.

In a particularly preferred aspect of the invention, the foil may comprise copper and the plastic film layer may comprise a polyester, preferably a polyester such as a polyethylene terphthalate.

In a different but related aspect of the invention, a procedure is provided for protecting a conductive metallic foil during further handling and use in the preparation of laminates and printed circuit board components therefrom. The procedure comprises the steps of providing a piece of conductive foil having two sides, one side being adapted for bonding to a dielectric support through the use of a lamination process involving pressing between plates of a laminating press. A layer of a dielectric plastic film is also provided and the latter is placed in overlying, covering and protecting relationship to the other side of said piece of metallic foil. The layer of film is then removably joined with the metallic foil sufficiently to permit movement and further processing of the foil with the film layer remaining in said covering relationship to said other side of the foil. In accordance with the invention, the layer of film and the foil are removable joined by forcing said layer of film and said foil together by applying thereto an evenly distributed force pattern to drive or squeeze gaseous material out from between the film and the other side of the foil and produce an essential absence of gaseous material (or vacuum) between the film and the other side of the foil, whereby the plastic film layer conforms intimately to the contours and shape of the other side of the foil and clings tightly thereto to permit movement and further processing of the foil with the film layer remaining in said covering, protecting relationship to said other side of the foil. The plastic film layer is removable from the foil by peeling. The plastic film should be sufficiently resistant to the temperature and pressure conditions encountered during the lamination process to avoid sticking to a laminating press plate and to retain its removability from the foil after lamination of the foil to a dielectric support. In accordance with a preferred aspect of the invention, the evenly distributed force pattern is created by oppositely static electrically charging said film and said foil.

Clearly the procedure of the invention is applicable in conjunction with conductive foils generally and in particular with electrodeposited conductive metallic foils and plastic film layers of the sort outlined above. Further, the invention is applicable in conjunction with those instances wherein the shiny side of an electrodeposited foil has been treated for enhanced lamination bond strength between the shiny side and a dielectric support; wherein the plastic film is removable after laminating Without disturbing such treatment; wherein the plastic film layer is sufficiently transparent to permit visual inspection of the shiny side of the metallic foil and/or the treatment thereon while the film layer remains in its covering, protective relationship to the foil; wherein the foil and the film layer are in the form of elongated webs that are wound up together in the form of a roll; wherein the foil and the plastic film layer are coextensive in size and are laid-up with a coextensively sized dielectric support layer containing a curable laminating resin disposed against the matte side of the foil; wherein the plastic film layer has a thickness in the range from about 0.5 to about 5.0 mils and which preferably is about 2.0 mils or less; wherein the plastic film layer is capable of being exposed to the conditions encountered in the laminating press without releasing chemicals which might contaminate the foil; wherein the foil comprises copper; and/or wherein the plastic film layer comprises a polyester, and preferably a polyethylene terphthalate polyester.

The invention also provides a procedure for releasably joining a protective, covering layer of dielectric film to one side of a conductive metallic foil adapted for being bonded to a dielectric support during a lamination process. In this aspect of the invention, the procedure includes a step of providing a piece of conductive foil having two sides, with one side of the foil being adapted for bonding to a dielectric support by a lamination process involving pressing between plates of a laminating press. A layer of dielectric film is provided and which is sufficiently resistant to the temperature and pressure conditions encountered during a lamination process to avoid sticking to a laminating press plate or to a piece of foil after exposure to laminating conditions. The layer of film is placed over the other side of said piece of foil in a covering, protecting relationship thereto. In accordance with the invention, the procedure includes the step of oppositely static electrically charging the film and the foil to cause the film and the foil to be attracted to one another with sufficient force to thereby drive gaseous material out from between the film and the other side of the foil and produce an essential absence of gaseous material between the film and the other side of the foil. Thus, the plastic film layer conforms intimately to the contours and shape of the other side of the foil and clings tightly thereto sufficiently to permit movement and further processing of the foil with the film layer remaining in its covering, protecting relationship to said other side of the foil. The plastic film layer is removable from the foil by peeling.

In accordance with the procedure of the invention, the static electrical charges on the film and on the foil are evenly distributed over the respective surfaces thereof whereby the film and the foil are attracted together by an evenly distributed force pattern. In a preferred aspect of the invention the static electrically charging step includes passing the foil with the film thereon through an electrical gradient field.

In a particularly preferred form of the invention, an electrical gradient field is established by providing a positively charged, generally straight conductive wire electrode and causing the foil to be a negatively charged electrode. The wire is positioned in laterally spaced, generally parallel relationship relative to the major plane of the foil, and the foil with the film thereon are moved in a direction which is generally parallel to the plane of the foil and which is generally transverse relative to the longitudinal axis of said wire. The film is positioned between the wire and the foil during such movement thereof.

Preferably the foil is in conductive contact with the surface of a rotating, conductive, negatively charged roller during the movement of the foil with the film thereon and the roller is arranged for rotation about an axis that is generally parallel to the longitudinal axis of said wire.

In this preferred form of the invention the wire may be formed from stainless steel and may have a diameter of about 0.008 inches, the gap between the wire and the roller may be approximately ⅜ inches, and a voltage potential of about 15 kV may be applied between said roller and said wire.

In another aspect of the invention the procedure may include the step of causing the film to be brought into contact with a grounding element after the foil with the film thereon have been passed through the electrical gradient field. In this regard an elongated static grounding element may be provided that is disposed in laterally spaced, generally parallel relationship relative to said wire, and which element is located in a position for contacting and grounding the foil after the foil and the film have been moved through said field. Preferably the grounding element may be positioned for simultaneously contacting the entire lateral extent of said film as the latter is moved in said direction.

In yet another aspect of the invention, the same provides a protected conductive foil laminate which comprises a conductive metallic foil as specified above, a plastic film layer overlying one side of the foil in removable covering, protecting relationship thereto and a dielectric support. In accordance with the invention there is an essential absence of air or other gaseous material between the plastic layer and said other side of the foil, whereby the plastic film layer conforms intimately to the contours and shape of the other side of the foil and clings tightly thereto sufficiently to permit movement and further processing of the foil with the film layer remaining in said covering, protecting relationship to said other side of the foil. The plastic film layer is removable from the foil by peeling. In this aspect of the invention the other side of the foil is bonded to the support through the utilization of a lamination process involving pressing between the plates of a laminating press, and the plastic film layer remains removably joined to the foil sufficiently to permit movement and further processing of the laminate with the film layer remaining in said covering, protecting relationship to the foil. In this connection, the plastic film is characterized as having initially been, prior to the lamination process, sufficiently resistant to the temperature and pressure conditions generally encountered during such process to avoid sticking to a laminating press plate and to retain its removability from the foil after lamination of the foil to the dielectric support.

DETAILED DESCRIPTION OF THE PREFERRED EMBODIMENTS

As outlined above, the present invention relates to the protection of foil materials which are eventually to be processed to form printed circuits. In this regard, the invention is applicable generally to all kinds of conductive foils and the methodology for preparing and/or producing the foil is not a critical feature of the present invention. For example, the invention may be used to provide protection for electrodeposited foils, for rolled (wrought) foils, for multi-layer layer foils, for clad foils, etc. Additionally, the specific conductive metal which is utilized for forming the foil is not a feature of the invention, and the invention is applicable generally whether the foil is of copper, nickel, chromium, or other conductive metal. Generally speaking, however, the invention has particular advantages when applied to copper foils prepared using conventional electrodeposition methodology whereby the foil has a smooth shiny side and a rough or matte side. Conventionally such foils are then bonded to dielectric substrates to provide dimensional and structural stability, and in this regard, it is conventional to bond the matte side of the electrodeposited foil to the substrate so that the shiny side of the foil faces outwardly from the laminate.

The specific features of the substrate are also not critical features of the invention and those skilled in the art are familiar with a large variety of such substrates. In a commercial sense, useful dielectric substrates may be prepared by impregnating woven glass reinforcement materials with partially cured resins, usually epoxy resins. Such dielectric substrates are commonly referred to as prepregs.

In preparing laminates, it is conventional for both the prepreg material and an electrodeposited copper foil material to be provided in the form of long webs of material rolled up in rolls. The rolled materials are drawn off the rolls and cut into rectangular sheets. The rectangular sheets are laid-up or assembled in stacks of assemblages. Each assemblage may comprise a prepreg sheet with a sheet of foil on either side thereof, and in each instance, the matte side of the copper foil sheet is positioned adjacent the prepreg so that the shiny sides of the sheets of foil face outwardly on each side of the assemblage.

The assemblages may be subjected to conventional laminating temperatures and pressures between the plates of laminating presses to prepare laminates comprising a sandwich of a sheet of prepreg between sheets of copper foil. Although it is commercially conventional to provide laminates with copper foil on each side of the prepreg, it is also within the contemplation of the present invention that the laminate might be made up of a single sheet of copper foil bonded to one side only of the prepreg.

As indicated above, the prepregs used conventionally in the art generally consist of a woven glass reinforcement fabric impregnated with a partially cured two-stage resin. By application of heat and pressure, the matte side of the copper foil is pressed tightly against the prepreg and the temperature to which the assemblage is subjected activates the resin to cause curing, that is cross linking of the resin and thus tight bonding of the foil to the prepreg dielectric substrate. Generally speaking, the laminating operation will involve pressures in the range of from about 250 to about 750 psi, temperatures in the range of from about 350° to 450° F., and a laminating cycle of from about 40 minutes to about 2 hours. The finished laminate may then be utilized to prepare printed circuit boards.

As set forth above in the description of the prior art, printed circuit board manufacturers seek methodology for producing smaller circuit lines and to otherwise densify the circuitry. As smaller and smaller lines are attempted, the toleration for contamination on the surface of the copper foil decreases rapidly. Such contamination may come from any one of a number of different sources.

In order to densify the circuitry of the printed circuit board, the single substrate laminates described above are married or joined together to present multi-layer printed circuit board structures. Such marriage or joinder is accomplished after the etching of the foil to thereby remove unwanted copper and present defined lines, etc. To then join a laminate with an etched pattern (inner layer) to another laminate with an etched pattern and thus present a multi-layer laminate, the outer surface of the copper inner layer which comprises the shiny side of the foil must be roughened and/or treated to enhance lamination bonding and improve peel strength in the finished structure. It has been traditional to treat the shiny surfaces of the printed copper circuit with a chemical oxide treatment to enhance subsequent bonding. To avoid such treatment, which generally must be accomplished after the printed circuit has been prepared, it has become desirable, at least for some applications, to provide a foil which has been treated to enhance lamination bonding and improve peel strength on both sides thereof. Such foils are known as double-treated foils. And in this regard, it should be pointed out that conductive foils are conventionally treated on the matte side for enhanced lamination bonding and peel strength between the matte side and the prepreg.

Typically the foil treatment involves treatment with a copper/copper oxide bonding material to increase surface area and thus enhance bonding and increase peel strength. The foil may also be treated to provide a thermal barrier, which may be brass, to prevent peel strength from decreasing with temperature. Finally, the foil may be treated with a stabilizer to prevent oxidation of the foil. These treatments are well known and the description thereof is not necessary at this point.

When the foil is double-treated, the treatments for enhanced bonding, improved peel strength and stabilization are applied to both sides of the foil. Through the use of double treated foil, the chemical oxide roughening step may be eliminated. However, the treatment on the shiny side of the double-treated foil is fragile and the treatment can be dislodged if the treated shiny side is not protected. This will result, at least at the points of injury to the treatment, in loss of bond strength, loss of peel strength and increased susceptibility to oxidation.

The present invention provides protection for either treated or untreated foil surfaces by providing an assemblage which includes a plastic film layer that overlies the foil in covering, protecting relationship thereto. In accordance with the concepts and principles of the invention, the plastic film layer is removably (or releasably) joined to the foil sufficiently to permit movement and further processing of the foil with the film layer remaining in its covering, protecting relationship relative to one side of the foil. The plastic film must be sufficiently resistant to the temperature and pressure conditions encountered during a lamination process so as to avoid sticking to the laminating press plate and so as to retain its ability to be removed from the foil after lamination of the foil to the dielectric support. The foil layer may then be etched using conventional methodology to present a printed circuit.

Figure 1:
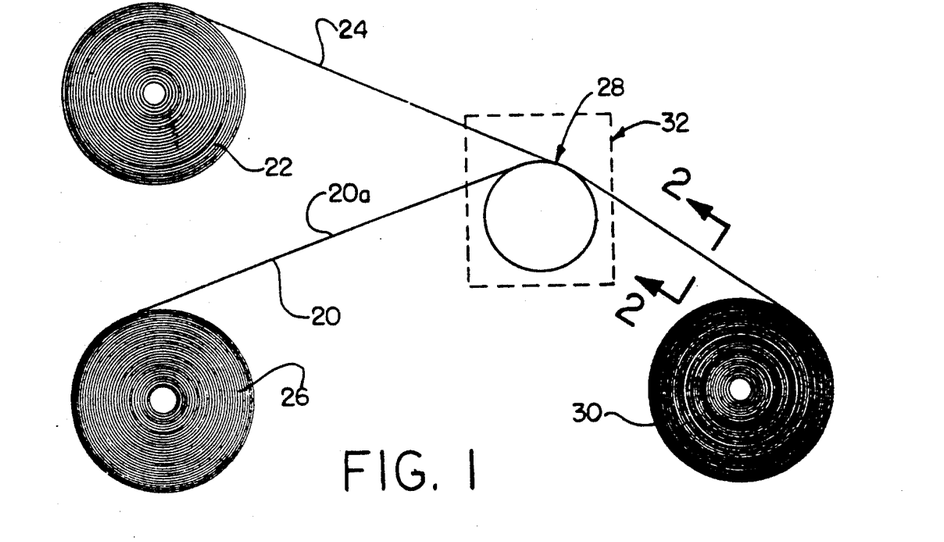
FIG. 1 is a schematic view illustrating a procedure for preparing a protected conductive foil assemblage in accordance with the invention.

A procedure for preparing a protected conductive foil assemblage which embodies the concepts and principles of the invention is illustrated in FIG. 1. In FIG. 1 a web of conductive metallic foil material 20 is pulled from a roll 26 thereof and a web of plastic film material 24 is pulled from a roll 22 thereof. The foil web 20 pulled from roll 26 and the plastic film web 24 pulled from roll 22 are caused to merge at point 28, and the interleafed assemblage is wound, for storage purposes, onto a roll 30.

Foil 20 may consist of any conductive material that is useful in the preparation of printed circuit board materials. Foil 20 may comprise, for example, conductive copper, or nickel, or chromium, or any other material which may be formed into a foil and then subsequently etched to present the PCB circuitry. Foil 20 may, for example, consist of a wrought foil prepared by rolling or a clad metal foil comprising two or more layers of metal. All such conductive foils may have at least one side that is specially treated for enhanced bonding to a dielectric support and another side that may be exposed to contamination and potential damage during storage, shipment and further processing. The present invention provides protection for such exposed side of the foil. Preferably, however, foil 20 may be an electrodeposited, double-treated, conductive copper foil. Although the thickness of the foil is not critical for purposes of the present invention, typically such foils are available commercially in thicknesses ranging from ⅜ ounce to 10 ounces. In this regard, the required thickness of the foil is generally a function of the eventual commercial application which may be known only to the final printed circuit board fabricator.

With regard to the plastic film layer 24, the same must simply operate to keep contamination off of the outer, otherwise exposed surface of the foil layer. As described above, such outer surface generally comprises either the treated or untreated shiny side of an electrodeposited foil. The plastic film must be capable of protecting the foil and must also be removable after the need for protection no longer exists. Additionally, the film must be sufficiently resistant to the temperature and pressure conditions encountered during lamination so that it does not stick to the laminating press plate and so that it retains its ability to be removed from the foil after the completion of the laminating process. Thus, the film must have sufficient temperature resistance to keep from melting at the temperatures of the laminating process since melting might cause fusing of the plastic material and the resultant sticking of the film to either the plate or the foil. Moreover, the plastic film should preferably be resistant to shrinking and capable of being exposed to the conditions encountered in the laminating press without releasing chemicals which might contaminate the foil.

It is desirable that the plastic film be capable of withstanding exposure to a temperature of about 475° F. for about 2 hours and to a temperature of about 325° F. for about 10 hours, without substantial dimensional change. Such characteristics are determinable using conventional testing methodology. Moreover, the plastic film should generally be free of volatile or organic material which might be released during laminating to contaminate the copper. Preferably, the plastic material utilized to protect the conductive foil should be transparent or translucent after exposure to laminating conditions to facilitate inspection of the underlying foil and/or the treatment thereon while protection of the foil is continued. For purposes of the present invention, the film should have dielectric characteristics.

For commercial purposes, the preferred film material should be readily available in widths of up to 80 inches. And in this connection, the present commercially available foils are generally available in nominal widths exceeding 40 inches. The plastic layers may have thicknesses ranging from about 0.5 to about 5.0 mils and the thickness preferably should be about 2.0 mils or less to avoid the necessity for enlarged packaging. The film should also be sufficiently flexible and soft at room temperatures to facilitate wrapping of the same around the roll up mandrels used in an interleafing process such as the one illustrated in FIG. 1. Finally, the plastic material should remain useful when subjected to temperatures ranging from about −50° F. to about 500° F. to facilitate storage in winter and utilization under laminating press conditions. Needless to say, many of the foregoing desirable characteristics are variable depending on process and end use parameters. And generally speaking, as will be appreciated by those skilled in the art to which the present invention pertains, empirical procedures will need to be employed in order to determine an optimum material for any given application.

A commercially preferred double-treated copper foil material for use in connection with the invention, is presently available from Gould Inc., Foil Division under the designation TC/TC. Such material is useful in multi-layer printed circuit board applications and is uniformly treated on both its shiny and matte sides with treatments to enhance bond strength, increase peel strength, and provide resistance to thermal, chemical and oxidative degradation.

A preferred plastic film material for protecting the treated shiny side of the TC/TC foil is a polyester film available commercially from DuPont under the designation Mylar 92 DB. Such material has a nominal thickness of about 0.92 mils; a density of about 1.395 g/cc, as determined by ASTM Spec D-1505; a tensile strength of 30,000 MD psi, as determined by ASTM Spec D-862, Method A; a tensile elongation of 100 MD%, as determined by ASTM Spec D-882, Method A; a tensile modulus of 547,000 MD psi, as determined by ASTM Spec D-882, Method A; an F-5 of 15,500 MD psi, as determined by ASTM Spec D-882, Method A; a melting point of 255° C., as determined by ASTM Spec D-3417; a shrinkage coefficient at 105° C. of 0.5 MD% and 0.5 TD%, each as determined by ASTM Spec D-1204; a coefficient of thermal expansion of $1.7 \times 10^{-5}$ inch/inch/°C., and Talysurf surface characteristics as determined by Taylor Hobson Talysurf Spec 5 of 0.031 Talysurf RA, 0.264 Talysurf RZ and 38 Talysurf NP. The preferred material is clear and contains only about 0.5 inclusions greater than 1.47 microns ($\mu$) per 100 sq/cm. In this latter regard, it is desirable that the film be sufficiently transparent to permit visual inspection of the underlying shiny side of the foil in compliance with Mil Spec 13949 for Mil Class B materials.

With further reference to FIG. 1, webs 20 and 24 may desirably have widths of about 42 inches. And since a popular commercial width useful in preparing printed circuit board materials is 39 inches, a one and one half inch marginal area is thus presented at each side of the web.

With reference to FIG. 1, the apparatus includes a mechanism 32 for removably joining film 24 to foil 20 at their merger point 28. Mechanism 32 is illustrated in greater detail in FIGS. 3, 4 and 5 and is operable for causing film 24 and foil 20 to be attracted to one another by an evenly distributed static electric force pattern of sufficient strength such that air and other gaseous materials are driven by squeezing out from between the film 24 and the foil 20. Thus, an essential absence of gaseous material (or vacuum) is produced between the foil 20 and the film 24. As a result, the plastic film 24 conforms intimately to the contours and shape of the surface of foil 20 and clings tightly thereto to permit movement and further processing of the foil 20 with the film 24 remaining in its covering protecting relationship to the foil 20. On the other hand, the film 24 is removable from foil 20 by peeling.

Figure 2:
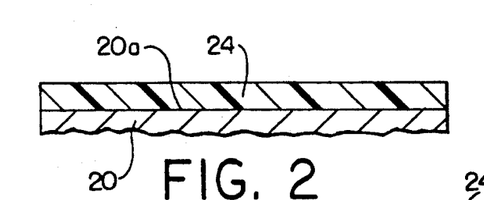
FIG. 2 is a view taken along line 2—2 of FIG. 1 and presenting a cross-sectional view of the protected conductive foil assemblage of the invention.

The webs 20 and 24 merge at point 28 and form an assemblage which is illustrated in FIG. 2. In this regard, it should be noted that FIG. 2 is a cross-sectional view taken along the line 2—2 in FIG. 1 to illustrate the assemblage which comprises the foil 20 and the plastic film 24, the latter now being removably joined to the foil as a result of the action of mechanism 32 s that it is in intimate covering, protecting relationship relative to the shiny side 20a of the foil.

Figure 3:
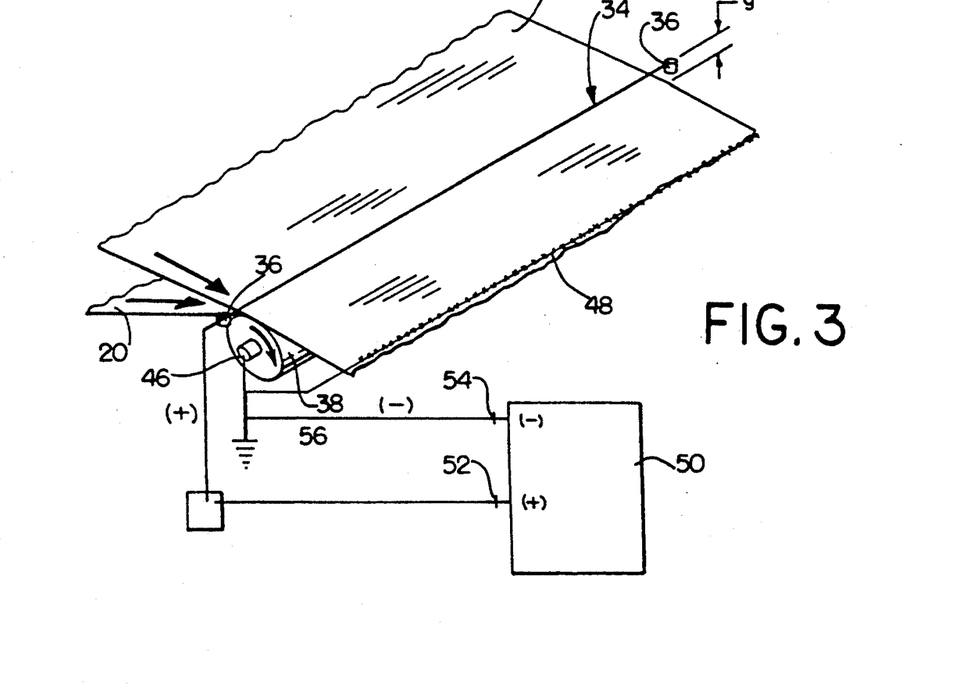
FIG. 3 is an isometric view illustrating the mechanism and procedure of the invention whereby the plastic film and the foil are attracted together to squeeze gaseous material out from therebetween so as to removably join the film and the foil.

The mechanism 32 is illustrated schematically in FIG. 3 and includes a wire electrode 34 supported by insulators 36, a roller 38 mounted for rotation about an axis 46, a static grounding ribbon 48 and a dc power supply 50.

Wire electrode 34 may have a diameter ranging from about 0.004 to about 0.025 inches and may be formed from any suitable electrically conductive material. Preferably, however, electrode 34 may be formed from a stainless steel wire having a diameter of about 0.008 inches.

Roller 38 is a conventional roller of the sort utilized widely in the foil processing art. Such rollers are illustrated, for example, in U.S. Pat. Nos. 4,022,648 and 3,589,975. The only really important criteria for roller 38 is that the surface thereof should preferably be formed from an electrically conductive material. As shown in FIG. 3, roller 38 is mounted for rotation about axis 46 in the direction of the arrow. Preferably roller 38 may have a metallic conductive surface, a length of about 65 inches, and a diameter of about 3 inches.

Electrode 34 is preferably mounted so that it extends between insulators 36 in essential parallelism with axis 46 of roller 38. Electrode 34 is also mounted in spaced relationship relative to the surface of roller 38 so as to present a gap g therebetween. The gap g may vary from about ¼ to about ½ inch; however, in the preferred embodiment illustrated herein, gap g should be about ⅜ inch. In this regard, gap g simply needs to be small enough so that a gradient field is established in film 24 and large enough to avoid sparking.

Power supply 50 is arranged to provide a dc voltage potential between roller 38 and electrode wire 34. For this purpose, power supply 50 may preferably be in the form of a Universal Voltronics Model BPA-22-10-D3 dc generator which is adjustable to provide 0 to 22 kV dc power. As shown in FIG. 3, wire 34 is connected to the positive terminal 52 of source 50 while roller 38 is connected to the negative terminal 54 of source 50. A ground 56 may be provided as is conventionally understood.

In operation, film 24 and foil 20 move together in the direction of the arrows in FIG. 3 and they converge at point 28 in the vicinity of roller 38. This is shown in more detail in FIG. 4. Power source 50 may ideally be adjusted to provide a dc electrical potential of about 15 kV, and under the dimensions and conditions outlined above, the operating current will be in the order of 2.5 milliamps. As will be appreciated by those skilled in the art, since foil 20 is formed from a conductive material, when it moves into contact with the surface of roller 38, foil 20 becomes the negatively charged electrode. In a general sense the voltage simply needs to be sufficient to establish a static electrical gradient field in the film 24 and should preferably be in the range of from about 5 kV to about 20 kV.

Thus, a static electrical gradient field is established between the positively charged electrode wire 34 and the negatively charged electrode provided by the copper foil 20. The wire is positioned in laterally spaced, generally parallel relationship relative to the major plane of the foil, and the foil with the film thereon are moved, at least at the top of roller 38, in a direction that is generally parallel relative to the plane of the foil and which is generally transverse relative to the longitudinal axis of wire 34. The electrical potential between wire 34 and foil 20 is uniformly distributed along the length of wire 34 under the conditions outlined above and the film 24 and foil 20 are moved at a constant rate so that the influence of the gradient field is uniformly applied to the film 24 as it passes through the electrical gradient field. Since film 24 is formed from a dielectric material, the described action creates a generally uniform static electrical charge that is applied evenly to film 24.

Figure 4:
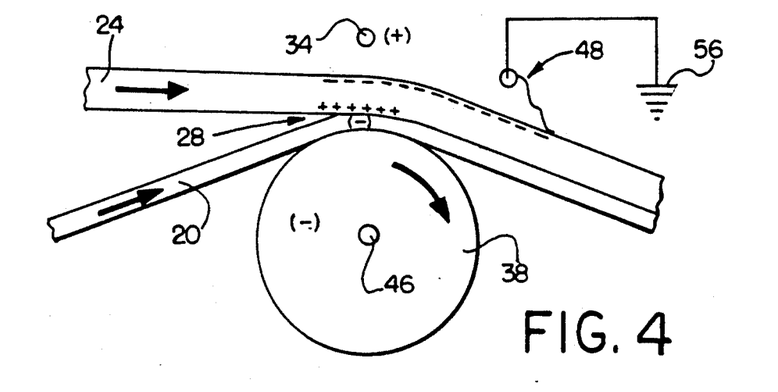
FIG. 4 is an enlarged side elevation view of the mechanism of FIG. 3 to further illustrate the procedure of the invention.

With reference to FIG. 4, the static electrical charge in the dielectric film 4 is believed to be distributed gradiently so that a positive charge accumulates on the surface of the film adjacent foil 20 as the film and the foil approach the merger point 28. The positive charge on the lower surface of film 24 and the negative charge on the foil 20 are strongly attractive and evenly distributed so that the negatively charged foil 20 and the positively charged lower surface of the film 24 are attracted and caused to converge, and the same are drawn or forced together with an evenly distributed force pattern such that air and other gaseous materials are squeezed or driven out from between the film and the foil to thus produce an essential absence of gaseous material (or vacuum) between the foil and the film.

The process thus described leaves a substantial static charge on the film. Such charge may interfere with further processing of the foil. Accordingly, in the preferred form of the invention, a grounding mechanism in the form of a static ribbon 48 is provided to ground and remove static charges from film 24. Ribbon 48 is disposed in laterally spaced relationship relative to wire 34 and is positioned far enough away from wire 34 such that it does not interfere with the attractive forces operating to expel air from between the foil and the film. This distance may vary from a few inches to several feet.

Figures 5, 6, 7, 8:
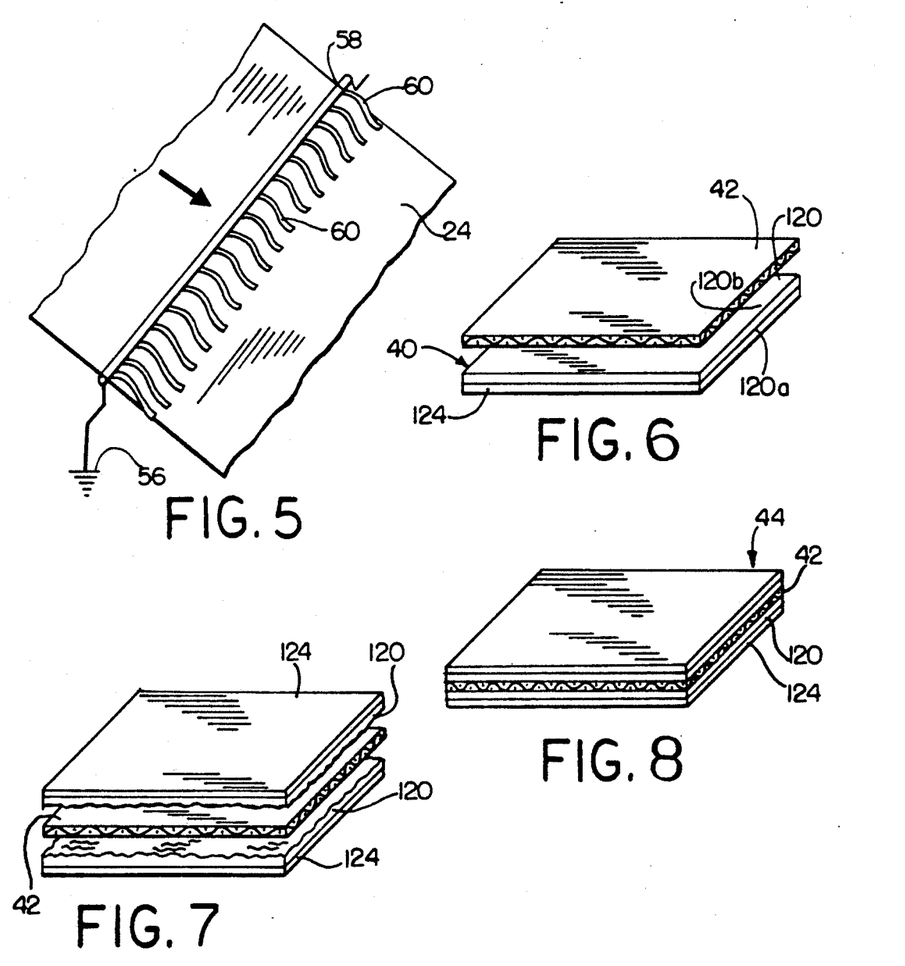
FIG. 5 is an isometric view illustrating the mechanism for grounding the film after the film has been removably joined to the foil.
FIG. 6 is a perspective exploded view of a protected conductive foil assemblage which embodies the principles and concepts of the invention.
FIG. 7 is a perspective exploded view illustrating another protected conductive foil assemblage which embodies the principles and concepts of the invention.
FIG. 8 is a protected conductive foil laminate which embodies the concepts and principles of the invention and which has been prepared utilizing the assemblage of FIG. 7.

Ribbon 48 is illustrated schematically in FIG. 5 and comprises an elongated conductive wire or rod 58 which extends across the width of film 24 and a plurality of strips 60 of conductive foil. The strips 60 are attached to wire 58 and preferably are like tinsel. The strips 60 are preferably flexible so that the free ends thereof simply drag on film 24 as the same moves past in the direction of the arrow. Strips 60 are distributed along the entire length of wire 58 so that the entire lateral extent of film 24 is contacted simultaneously by strips 60 as the film moves away from electrode 34. Element 58 is connected to ground 56. Thus, static charges are effectively substantially removed from film 24.

The net result of the process is that an essential absence of air or other gaseous material is created between film 24 and foil 20. This absence of air constitutes a vacuum which, in conjunction with any residual remaining static charges, causes the film to conform intimately to the contours and shape of the foil and to cling tightly thereto in a covering, protecting relationship. Accordingly, the foil may be moved and subjected to further processing while the film remains thereon in its covering and protecting position. The film 24 may readily be removed from the foil 20 when the time comes to do so simply by lifting a corner of the film and peeling the film back away from the corner by hand.

The linear speed of foil web 20 and plastic film 24 as the same pass electrode 34 in the direction of the arrows in FIGS. 3 and 4 may be varied to suit other process parameters.

Ideally such speed may range from about 80 to about 200 feet per minute. However, the removable bonding strength between web 20 and film 24 does not seem to be affected to any great degree by the linear speed of web 20 and film 24 as the same pass under electrode 34.

Removable bonding strength may be measured using an Instron Model 1130 universal testing machine. When this machine is used to separate 2 inch wide strips of material using a 500 gram load cell it appears that the removable bonding strength does vary to some degree with voltage. The relationship appears to be essentially a straight line function in the voltage ranges mentioned above. Thus, at an applied voltage of 8 kV the measured bond strength is approximately 0.68 g/in, at 12 kV the bond strength is approximately 1.36 g/in and at 16 kV the bond strength is approximately 2.04 g/in. These relationships may be expressed by the following equation:

$$\text{Bond strength; } g/in = (0.17 \cdot kV) - 0.68$$

To utilize the materials wound up on roll 30, the material is unwound from the roll and the web material is cut across the web to present individual sheets of material. In the case of the present invention, when the material is unwound from roll 30 and cut, the resultant product will be a protected conductive foil assemblage 40 as illustrated in FIG. 6. Assemblage 40 is made up of a piece of conductive metallic foil 120 which has a side 120b and a side 120a. As illustrated in FIG. 6, the side 120a is covered by plastic film layer 124 and thus cannot be seen, except for the edge thereof. Side 120b of foil 120 is adapted for bonding to a dielectric support by a lamination process involving pressing between platens of a laminating press. Thus, side 120b has been pretreated for enhanced bond strength, improved peel strength resistance to thermal and chemical degradation and stabilization against oxidation. Plastic film layer 124 overlies side 120a in covering, protecting relationship thereto. As explained previously, plastic film layer 124 is removably joined to the foil sufficiently to permit movement and further processing of the foil with the film layer remaining in said covering, protecting relationship to the side 120a of the foil by virtue of the fact that there is an essential absence of gaseous material between the film and the foil whereby the film conforms intimately to the contours and shape of the surface of side 120a of foil 120 and clings tightly thereto.

After assemblage 40 has been cut from the material drawn from roll 30, the assemblage 40 is laid-up with a coextensively sized dielectric support layer 42. Layer 42 preferably may be a prepreg as described above and which contains a curable laminating resin. During the lay-up procedure, the prepreg 42 is simply brought into contact with the side 120b of foil 120. The laid-up materials are thus ready for the lamination process to bond the prepreg 42 to the side 120b of foil 120 while plastic film 124 remains in its covering, protecting relationship relative to side 120a of the foil.

FIG. 6 represents a protected conductive foil assemblage which comprises a prepreg dielectric support layer 42 and a single piece of protected foil. For other applications, however, it may be more desirable to lay-up the prepreg 42 with a protected layer of foil on each side thereof. This is illustrated in FIG. 7, where the prepreg 42 is illustrated as having a foil layer 120 on each side thereof. And in each instance, the foil layer 120 is protected by a corresponding plastic film layer 124. After lay-up and lamination, the assemblage of FIG. 7 takes the form of the laminate 44 shown in FIG. 8. Laminate 44 comprises the prepreg 42, the pieces of metallic foil 120 which have one of their sides bonded to the prepreg 42, and the plastic film layers 124 disposed in covering, protecting relationship relative to the other (outer) sides of the foil layers 120.

In the case of the preferred embodiments described above, the plastic film layer is removably joined with the foil by use of evenly distributed static electrical forces which force the film layer and foil together with an evenly distributed force pattern to drive gaseous material out from between the film and the surface of the foil to produce an essential absence of gaseous material (or vacuum) between the film and the foil. The vacuum thus created causes the film to conform intimately to the contours and shape of the foil surface so that the film clings tightly to the foil to permit movement and further processing of the foil while the protective film remains in place thereon in covering, protecting relationship thereto. This is an improvement over the procedures utilized in said co-pending application Ser. No. 07/347,841, where an adhesive material is placed in the marginal area of the foil. In that case the foil and film layer may be pulled apart manually or the marginal area may simply be cut off of the assemblage whereby the plastic film is readily separated or removed from the foil. This is a valuable procedure; however the added steps needed to apply the adhesive, and the waste resulting from removal of the marginal area result in a procedure which is less efficient and effective than the preferred procedures of the present invention. Likewise the procedures wherein the film is heated to cause it to conform to the topography of the foil and/or adhere to the marginal areas are less efficient than the present procedure where the film and foil are forced together only by static electrical forces and held together thereafter by the absence of gaseous material (or vacuum) created when the static forces squeeze the air out from between the foil and the protective film.

We claim:

1. A protected conductive foil assemblage comprising:
   a conductive metallic foil having two sides, one side of the foil being adapted for bonding to a dielectric support during a lamination process involving pressing between plates of a laminating press; and
   a dielectric plastic film layer overlying the other side of the foil in covering, protecting relationship thereto, there being an essential absence of gaseous material between the plastic film layer and said other side of the foil, whereby the plastic film layer conforms intimately to the contours and shape of the other side of the foil and clings tightly thereto to permit movement and further processing of the foil with the film layer remaining in said covering, protecting relationship to said other side of the foil, said plastic film layer being removable from the foil by peeling, said plastic film being sufficiently resistant to the temperature and pressure conditions encountered during a lamination process to avoid sticking to a laminating press plate and to retain its removability from the other side of the foil after lamination of the foil to a dielectric support.

2. A protected film assemblage as set forth in claim 1, wherein said foil is an electrodeposited foil having a matte side and a shiny side, said one side being the matte side and said other side being the shiny side.

3. A protected foil assemblage as set forth in claim 2, wherein said shiny side has been treated for enhanced lamination bond strength between the shiny side and a dielectric support and said plastic film is removable after laminating without disturbing said treatment.

4. A protected foil assemblage as set forth in claim 3, wherein said plastic film layer is sufficiently transparent to permit visual inspection of the treatment on the shiny side of the metallic foil while said film layer is in said covering, protecting relationship thereto.

5. A protected foil assemblage as set forth in claim 1, wherein said plastic film layer is sufficiently transparent to permit visual inspection of the other side of the metallic foil while said film layer is in said covering, protecting relationship thereto.

6. A protected foil assemblage as set forth in claim 1, wherein said foil and said film layer are in the form of webs and are wound up together in the form of a roll.

7. A protected foil assemblage as set forth in claim 1, wherein said foil and said plastic film layer are coextensive in size and said assemblage includes a coextensively sized dielectric support layer containing a curable laminating resin disposed against said one side of the foil.

8. A protected foil assemblage as set forth in claim 1, wherein said plastic film layer has a thickness in the range of from about 0.5 mil to about 5.0 mils.

9. A protected foil assemblage as set forth in claim 8, wherein said plastic film layer has a thickness of about 2.0 mils or less.

10. A protected foil assemblage as set forth in claim 1, wherein said plastic film layer is capable of being exposed to the conditions encountered in a laminating press without releasing chemicals which contaminate the foil.

11. A protected foil assemblage as set forth in claim 1, wherein said foil comprises copper.

12. A protected assemblage as set forth in claim 11, wherein said plastic film comprises a polyester.

13. A protected assemblage as set forth in claim 12, wherein said polyester comprises a polyethylene terphthalate.

14. A protected assemblage as set forth in claim 1, wherein said plastic film layer comprises a polyester.

15. A protected assemblage as set forth in claim 14, wherein said polyester comprises a polyethylene terphthalate.

16. A procedure for protecting an electrodeposited conductive metallic foil during further processing comprising:
providing a piece of conductive foil having two sides, one side of the foil being adapted for bonding to a dielectric support by a lamination process involving pressing between plates of a laminating press;
providing a layer of dielectric plastic film;
placing said layer of film over the other side of said piece of metallic foil in covering, protecting relationship to said other side; and
forcing said layer of film and said foil together by applying thereto an evenly distributed force pattern to drive gaseous material out from between the film and the other side of the foil and produce an essential absence of gaseous material between the film and the other side of the foil, whereby the plastic film layer conforms intimately to the contours and shape of the other side of the foil and clings tightly thereto to permit movement and further processing of the foil with the film layer remaining in said covering, protecting relationship to said other side of the foil, said plastic film layer being removable from the foil by peeling,
said plastic film being sufficiently resistant to the temperature and pressure conditions encountered during a lamination process to avoid sticking to a laminating press plate and to retain its removability from the other side of the foil after lamination of the foil to a dielectric support.

17. A procedure as set forth in claim 16, wherein said evenly distributed force pattern is created by oppositely static electrically charging said film and said foil.

18. A procedure for releasably joining a protective, covering layer of dielectric film to one side of a conductive metallic foil adapted for being bonded to a dielectric support during a lamination process, said procedure comprising the steps of:
providing a piece of conductive foil having two sides, one side of the foil being adapted for bonding to a dielectric support by a lamination process involving pressing between plates of a laminating press;
providing a layer of dielectric film which is sufficiently resistant to the temperature and pressure conditions encountered during a lamination process to avoid sticking to a laminating press plate or to a piece of foil after exposure to laminating conditions;
placing said layer of film over the other side of said piece of foil in a covering, protecting relationship thereto; and
oppositely static electrically charging said film and said foil to cause said film and said foil to be attracted to one another to thereby drive gaseous material out from between the film and the other side of the foil and produce an essential absence of gaseous material between the film and the other side of the foil, whereby the plastic film layer conforms intimately to the contours and shape of the other side of the foil and clings tightly thereto to permit movement and further processing of the foil with the film layer remaining in said covering, protecting relationship to said other side of the foil, said plastic film layer being removable from the foil by peeling.

19. A procedure as set forth in claim 18, wherein the static electrical charges on said film and on said foil are evenly distributed over the respective surfaces thereof whereby the film and the foil are attracted together by an evenly distributed force pattern.

20. A procedure as set forth in claim 19, wherein said charging step includes passing said foil with the film thereon through an electrical gradient field.

21. A procedure as set forth in claim 20, wherein said electrical gradient field is established by providing a positively charged generally straight conductive wire electrode and causing said foil to be a negatively charged electrode, said wire being positioned in laterally spaced, generally parallel relationship relative to the major plane of the foil, said foil with the film thereon being moved in a direction which is generally parallel to the plane of the foil and which is generally transverse relative to the longitudinal axis of said wire, said film being positioned between the wire and the foil during said movement thereof.

22. A procedure as set forth in claim 21, wherein said foil is in conductive contact with the surface of a rotating, conductive, negatively charged roller during said movement of the foil with the film thereon.

23. A procedure as set forth in claim 22, wherein said roller is arranged for rotation about an axis that is generally parallel to the longitudinal axis of said wire.

24. A procedure as set forth in claim 21, wherein said wire has a diameter of approximately 0.008 inches.

25. A procedure as set forth in claim 21, wherein said wire is formed from stainless steel.

26. A procedure as set forth in claim 21, wherein the lateral gap between said wire and said foil is approximately ⅜ inch.

27. A procedure as set forth in claim 21, wherein a voltage potential of 15 kV is applied between said wire and said foil.

28. A procedure as set forth in claim 23, wherein said wire is formed from stainless steel and has a diameter of about 0.008 inches, wherein the gap between said wire and said roller is approximately ⅜ inches, and wherein a voltage potential of about 15 kV is applied between said roller and said wire.

29. A procedure as set forth in claim 20 wherein is included the step of causing said film to be brought into contact with a grounding element after said foil with the film thereon have been passed through the electrical gradient field.

30. A procedure as set forth in claim 21, wherein is included the step of providing an elongated static grounding element disposed in laterally spaced, generally parallel relationship relative to said wire, said element being located in a position for contacting and grounding said foil after the foil and the film have moved through said field.

31. A procedure as set forth in claim 30, wherein said element is positioned for simultaneously contacting the entire lateral extent of said film as the latter is moved in said direction.

32. A protected conductive foil laminate comprising:
a conductive metallic foil having two sides;
a plastic film layer overlying one side of the foil in covering, protecting relationship thereto; and
a dielectric support bound to the other side of the foil as a result of having undergone a lamination process involving pressing between plates of a laminating press,
there being an essential absence of gaseous material between the plastic film layer and said other side of the foil, whereby the plastic film layer conforms intimately to the contours and shape of the other side of the foil an clings tightly thereto to permit movement and further processing of the foil with the film layer remaining in said covering, protecting relationship to said other side of the foil, said plastic film layer being removable from the foil by peeling,
said plastic film being characterized as having initially been sufficiently resistant to the temperature and pressure conditions encountered during the lamination process to avoid sticking to a laminating press plate and to retain its removability from the other side of the foil after lamination of the foil to said dielectric support.

33. A protected foil laminate as set forth in claim 32, wherein said foil is an electrodeposited foil having a matte side and a shiny side, said one side being the matte side and said other side being the shiny side.

34. A protected foil laminate as set forth in claim 33, wherein said shiny side has been treated for enhanced lamination bond strength between the shiny side and a second dielectric support and said plastic film is removable without disturbing said treatment.

35. A protected foil laminate as set forth in claim 34, wherein said plastic film layer is sufficiently transparent to permit visual inspection of the shiny side of the metallic foil and the treatment thereon while said film layer is in said covering, protecting relationship thereto.

36. A protected foil laminate as set forth in claim 32, wherein said plastic film layer is sufficiently transparent to permit visual inspection of the other side of the metallic foil while said film layer is in said covering, protecting relationship thereto.

* * * * *